United States Patent
Ganger

(10) Patent No.: US 9,197,462 B2
(45) Date of Patent: Nov. 24, 2015

(54) SINGLE AMPLIFIER FILTER FOR CONSTANT GROUP DELAY IN RADIO FREQUENCY TRANSMITTERS

(71) Applicant: Jeffrey D. Ganger, Chandler, AZ (US)

(72) Inventor: Jeffrey D. Ganger, Chandler, AZ (US)

(73) Assignee: FREESCALE SEMICONDUCTOR INC., Austin, TX (US)

(\*) Notice: Subject to any disclaimer, the term of this patent is extended or adjusted under 35 U.S.C. 154(b) by 0 days.

(21) Appl. No.: 14/460,627

(22) Filed: Aug. 15, 2014

(65) Prior Publication Data

US 2014/0369439 A1    Dec. 18, 2014

Related U.S. Application Data

(62) Division of application No. 12/259,765, filed on Oct. 28, 2008, now Pat. No. 8,816,758.

(51) Int. Cl.
| | |
|---|---|
| *H04B 1/02* | (2006.01) |
| *H04L 25/08* | (2006.01) |
| *H03H 11/12* | (2006.01) |
| *H03M 1/66* | (2006.01) |

(52) U.S. Cl.
CPC ............ *H04L 25/08* (2013.01); *H03H 11/126* (2013.01); *H03M 1/66* (2013.01)

(58) Field of Classification Search
CPC ........ H04B 1/69; H04B 1/707; H04B 1/7163; H04B 1/71637; H04B 1/7174
See application file for complete search history.

(56) References Cited

U.S. PATENT DOCUMENTS

| | | | |
|---|---|---|---|
| 6,583,662 B1 * | 6/2003 | Lim ............................ | 327/553 |
| 7,333,791 B2 * | 2/2008 | Richter et al. ................ | 455/302 |
| 2004/0032363 A1 * | 2/2004 | Schantz et al. ............... | 342/127 |
| 2006/0293011 A1 * | 12/2006 | Park et al. ..................... | 455/260 |

\* cited by examiner

*Primary Examiner* — Sibin Chen
(74) *Attorney, Agent, or Firm* — Ingrassia Fisher & Lorenz, P.C.

(57) ABSTRACT

Apparatus and systems are provided for a single amplifier filter capable of a high quality factor. A filter comprises an amplifier having an amplifier input and an amplifier output, wherein the amplifier is configured to produce an output signal at the amplifier output based on a signal at the amplifier input. A first resistive element is coupled between an input node and the amplifier input, a second resistive element is coupled between a first node and the amplifier input, and a third resistive element is coupled between the amplifier output and the first node. A first capacitive element is coupled between the amplifier output and the amplifier input. The filter comprises a second node for an inverse of the output signal, wherein a second capacitive element is coupled between the first node and the second node.

20 Claims, 2 Drawing Sheets

SINGLE AMPLIFIER FILTER FOR CONSTANT GROUP DELAY IN RADIO FREQUENCY TRANSMITTERS

CROSS-REFERENCE TO RELATED APPLICATIONS

This is a division of U.S. patent application Ser. No. 12/259,765, filed Oct. 28, 2008.

TECHNICAL FIELD

Embodiments of the subject matter described herein relate generally to signal filtering, and more particularly, embodiments of the subject matter relate to circuits and systems for controlling the group delay of an output signal using a single amplifier filter.

BACKGROUND

Transmitters or transceivers convert a digital baseband signal into an analog input signal, which is modulated to produce a radio frequency (RF) signal. The RF signal is amplified by a power amplifier and provided to an antenna for transmission. In most systems, a low-pass filter or reconstruction filter is utilized remove any potential harmonics or images from the analog input signal as a result of the digital-to-analog conversion. The reconstruction filter removes undesirable harmonics in order to prevent them from being amplified by the power amplifier and transmitted in adjacent communication channels, also known as adjacent channel leakage.

In order to keep the analog input signal as pure as possible and minimize distortion, it is desirable that the reconstruction filter have a flat gain response and constant group delay for passband frequencies below the cutoff frequency of the reconstruction filter. However, in order to avoid adjacent channel leakage, the reconstruction filter is generally designed to have a sharp transition and attenuation for frequencies above the cutoff frequency. As a result, in practice, the reconstruction filter is unable to achieve both a flat gain response and constant group delay. Often, the reconstruction filter is tailored for a flat gain response. However, the resulting group delay may lead to undesirable distortion of the analog input signal.

In some systems, an additional filter is utilized to compensate for the group delay of the reconstruction filter, such that the overall group delay of the analog input signal is substantially constant. Generally, this additional filter is realized using one or more second-order active filter topologies as building blocks in a modular fashion. In order to achieve higher quality factors (e.g., quality factors of 10 or more), which in turn allow a system designer to manipulate the group delay, a conventional filter topologies are implemented such that a negative gain component is introduced. As a result, in order to provide a negative gain component without inverting the output signal, these conventional second-order filter topologies are often cascaded or configured in a manner which involves more than one amplifier. For example, a Tow-Thomas biquad circuit utilizes three amplifiers to achieve a high quality factor. Many transmitters are used in mobile devices, such as cellular phones or handheld computers, where the battery life/power consumption and the size of the device are two important design considerations. However, each additional amplifier increases the physical area along with the current and/or power consumption of the filter, and thus, the prior art filter topologies are undesirable.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
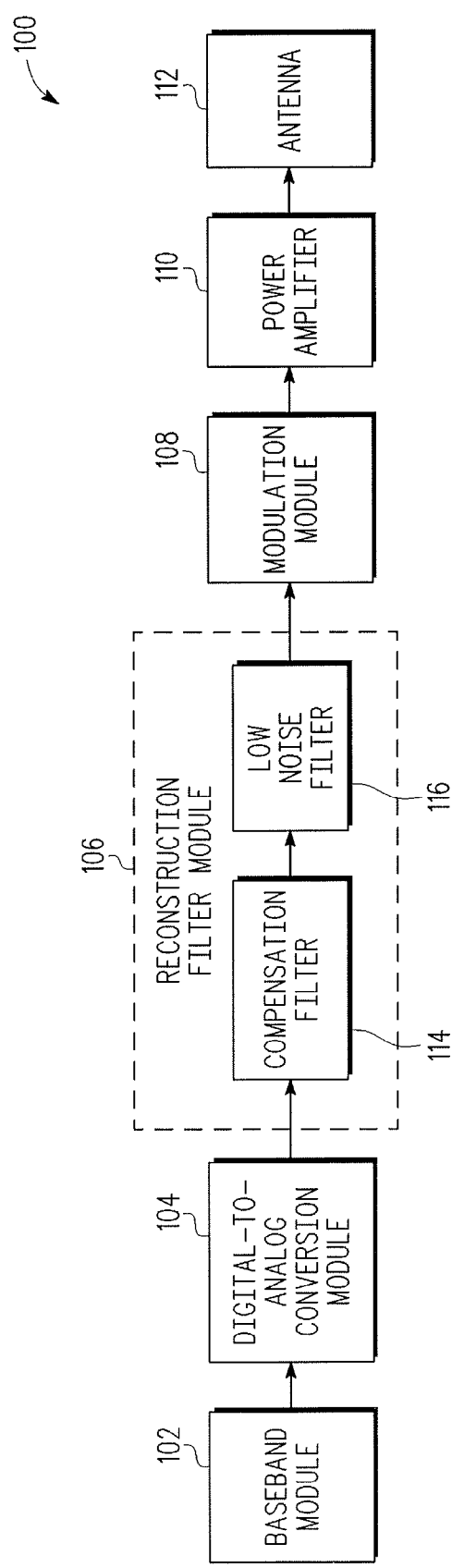
FIG. 1 is a block diagram of a transmitter in accordance with one embodiment of the present invention.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description. In addition, certain terminology may also be used in the following description for the purpose of reference only, and thus are not intended to be limiting. For example, the terms "first", "second" and other such numerical terms referring to structures do not imply a sequence or order unless clearly indicated by the context.

The following description refers to elements or nodes or features being "coupled" together. As used herein, unless expressly stated otherwise, "coupled" means that one element is directly or indirectly joined to (or directly or indirectly communicates with) another element, and not necessarily mechanically. Thus, although the schematics shown in the figures depict exemplary arrangements of elements, additional intervening elements, devices, features, or components may be present in an embodiment of the depicted subject matter.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

For the sake of brevity, conventional techniques related to transmitter and transceiver design, baseband programming, amplifier design, digital-to-analog conversion, sampling, analog circuit design, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter. It should be understood that circuitry described herein may be implemented either in silicon or another semiconductor material or alternatively by software code representation thereof.

Technologies and concepts discussed herein relate to systems and circuits for filtering analog signals in a transmitter such that the filtered signal exhibits substantially constant group delay for the passband. A single amplifier biquad filter topology is utilized in a transmitter to compensate for the group delay, such that the signal that is eventually amplified and transmitted has substantially constant group delay, and thus, minimal phase distortion.

FIG. 1 depicts a transmitter 100 in accordance with one embodiment. In an exemplary embodiment, the transmitter 100 is realized as a radio frequency (RF) transmitter. The transmitter 100 includes, without limitation, a baseband module 102, a digital-to-analog conversion module 104, a reconstruction filter module 106, a modulation module 108, a power amplifier 110, and an antenna 112. In an exemplary embodiment, the reconstruction filter module 106 is configured such that it has a substantially flat gain response and substantially constant group delay for frequencies below a cutoff frequency, as described in greater detail below. The transmitter 100 may be realized for use in a mobile device application, such as a cellular telephone that operates with a typical output power range from around 24 dBm to 33 dBm and a typical operating frequency range of approximately 1 to 3 GHz, depending on the particular communication standard or protocol being utilized.

It should be understood that FIG. 1 is a simplified representation of a transmitter 100 for purposes of explanation and ease of description, and that practical embodiments may include other devices and components for providing additional functions and features, and/or the transmitter 100 may be part of a transceiver or a larger system, as will be understood. Various implementation aspects of RF transmitters are well known and so, in the interest of brevity, many conventional steps or elements will only be mentioned briefly herein or will be omitted entirely without providing the well known details.

In an exemplary embodiment, the baseband module 102 is coupled to the digital-to-analog conversion module 104 which, in turn, is coupled to the reconstruction filter module 106. In an exemplary embodiment, the reconstruction filter module 106 includes a compensation filter 114 and a low noise filter 116. The compensation filter 114 is coupled to the output of the digital-to-analog conversion module 104. The output of the compensation filter 114 is coupled to the low noise filter 116 which, in turn, is coupled to the modulation module 108. The modulation module 108 generates a RF signal based on an analog signal from the reconstruction filter module 106 (or low noise filter 116). The output of the modulation module 108 is coupled to the power amplifier 110, which amplifies the RF signal. It should be appreciated in the art that although not illustrated, one or more intermediate power gain stages may be coupled between the modulation module 108 and the power amplifier 110 as needed. The output of the power amplifier 110 is coupled to the antenna 112 and provides the amplified RF signal to the antenna 112 for RF transmission in a conventional manner.

In an exemplary embodiment, the baseband module 102 is configured to generate or otherwise provide baseband signals to the digital-to-analog conversion module 104. In an exemplary embodiment, the baseband signals are digital signals that represent a desired analog waveform for transmission, as will be appreciated in the art. The digital-to-analog conversion module 104 receives the baseband signals and converts the digital baseband signal to an analog baseband signal in a conventional manner. In this regard, although not illustrated, the digital-to-analog conversion module 104 may include one or more digital-to-analog converters (DACs) and other components for interpolating the baseband signals to an appropriate data rate and generating an analog baseband signal.

In an exemplary embodiment, the reconstruction filter module 106 provides an analog input signal for the modulation module 108 by filtering the analog baseband signal generated by the digital-to-analog conversion module 104 with a substantially flat gain response and substantially constant group delay for passband frequencies below the cutoff frequency of the reconstruction filter module 106. In accordance with one or more embodiments, the cutoff frequency of the reconstruction filter module 106 is chosen as a frequency within a threshold tolerance (e.g., within +/−5%) of the predefined channel bandwidth for a communication protocol being used with the transmitter 100. For example, the Global System for Mobile communications (GSM) provides for a communication channel bandwidth of 200 kHz, while Wideband Code Division Multiple Access (WCDMA) provides for a communication channel bandwidth of 5 MHz, and various Long Term Evolution (LTE) protocols provide for communication channel bandwidths ranging from as low as 1 MHz to 20 MHz. It should be noted that the subject matter described herein is not limited to use with any particular protocol, and may be modified to accommodate any communication standard or protocol, as will be appreciated in the art.

In accordance with one embodiment, the low noise filter 116 is realized as a low-pass filter configured to attenuate frequency components of a received signal above its cutoff frequency. It will be appreciated in the art that the cutoff frequency of the low noise filter 116 will vary depending on the particular communication protocol that is utilized, as described above. In an exemplary embodiment, the low noise filter 116 is designed to have a sharp transition and attenuation for frequencies above the cutoff frequency with low noise and a substantially flat gain response for passband frequencies below the cutoff frequency. In this manner, the low noise filter 116 provides image rejection for the reconstruction filter module 106. In an exemplary embodiment, the compensation filter 114 is coupled between the low noise filter 116 and the digital-to-analog conversion module 104 and configured to generate an input signal for the low noise filter 116 based on the analog baseband signal. In this regard, the compensation filter 114 filters the analog baseband signal in a manner that compensates for the group delay and/or phase response of the low noise filter 116. As described in greater detail below, in an exemplary embodiment, the compensation filter 114 has enough degrees of freedom in terms of poles and zeros to compensate for the phase distortion of the low noise filter 116 over a desired bandwidth. In other words, the phase response of the transfer function for the compensation filter 114 approximates the inverse of the phase response of the low noise filter 116 over a desired bandwidth of compensation (e.g., passband frequencies below the cutoff frequency). In this manner, the group delay of the output signal of the reconstruction filter module 106 and/or low noise filter 116 relative to the analog baseband input signal is substantially constant (within practical and realistic operating tolerances) for the passband. In accordance with one embodiment, the group delay of the output signal of the reconstruction filter module 106 and/or low noise filter 116 relative to the analog baseband input signal is within plus or minus seven nanoseconds for frequencies below the cutoff frequency. In an exemplary embodiment, the compensation filter 114 is realized as a second-order active filter having only one amplifier, as described in greater detail below.

In an exemplary embodiment, the modulation module 108 is coupled to the low noise filter 116 and configured to generate an RF-modulated signal which is provided as an input signal for the power amplifier 110. In this regard, the modulation module 108 may include a combination of mixers, oscillators, and/or possibly other elements configured to generate the RF-modulated output signal by modulating the signal from the low noise filter 116 using a carrier signal in a conventional manner. In an exemplary embodiment, the power amplifier 110 amplifies the RF signal received from the modulation module 108 and provides the amplifier RF signal to the antenna 112 in a conventional manner.

Figure 2:
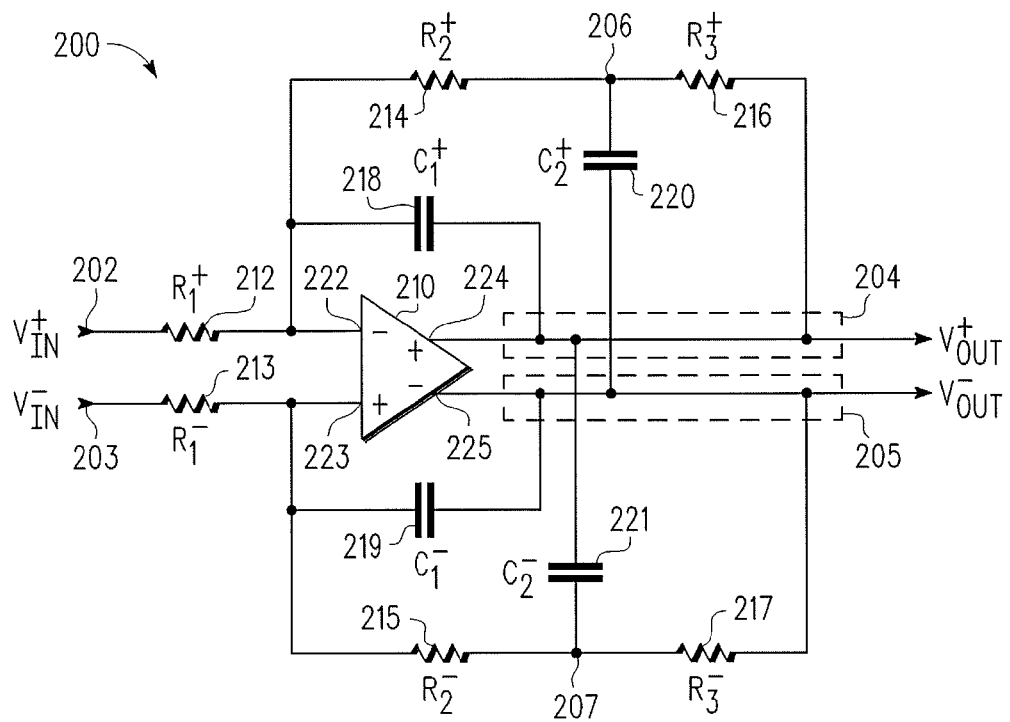
FIG. 2 is a schematic diagram of a differential implementation of a biquad filter suitable for use in the transmitter of FIG. 1 in accordance with one embodiment of the present invention.

FIG. 2 depicts a differential implementation of a biquad filter 200 suitable for use as the compensation filter 114 of the transmitter 100 of FIG. 1. As shown, the biquad filter 200 includes, without limitation, a first input node 202 for a positive component of a differential input signal ($V_{IN}^+$), a second input node 203 for a negative component of the differential input signal ($V_{IN}^-$), a first output node 204 for a positive component of a differential output signal ($V_{OUT}^+$), and a second output node 205 for a negative component of the differential output signal ($V_{OUT}^-$). The biquad filter 200 further includes a differential amplifier 210 having a first differential input 212 (e.g., the negative input, minus input, or inverting input), a second differential input 213 (e.g., the positive input, plus input, or non-inverting input), first differential output 224 (e.g., the positive output, plus output, or non-inverting output) coupled to the first output node 204, and a second differential output 225 (e.g., the negative output, minus output, or inverting output) coupled to the second output node 205. In this regard, the amplifier 210 is a fully differential amplifier configured to produce the positive component of the differential output signal (e.g., $V_{OUT}^+$) at the plus output 224 and the negative component of the differential output signal (e.g., $V_{OUT}^-$) at the minus output 225 based at least in part on the difference between the signal at the first differential input 222 and the signal at the second differential input 223. As described below, in an exemplary embodiment, the positive path (e.g., the path associated with $V_{IN}^+$ and $V_{OUT}^+$) and the negative path (e.g., the path associated with $V_{IN}^-$ and $V_{OUT}^-$) are symmetrical (e.g., realized substantially identical components), such that the output signal at the minus output 225 is equal to the inverse of the output signal at the plus output 224. That is, the magnitude of the second differential output is equal to the magnitude of the first differential output, but the second differential output has the opposite sign relative to the first differential output (e.g., $V_{OUT}^- = -V_{OUT}^+$), as will be appreciated in the art.

In an exemplary embodiment, a first resistive element 212 ($R_1^+$) is coupled between the first input node 202 and the first differential input 222. In the depicted embodiment, the resistive element 212 is configured such that one terminal of the resistive element 212 is connected to the first input node 202 and the other terminal is connected to the first differential input 222 (e.g., electrically in series between the first input node 202 and the first differential input 222). In a similar manner, a second resistive element ($R_2^+$) is coupled between a node 206 and the first differential input 222, and a third resistive element ($R_3^+$) is coupled between the first differential output 224 and the node 206. Likewise, a fourth resistive element 213 ($R_1^-$) is coupled between the second input node 203 and the second differential input 223, a fifth resistive element 215 ($R_2^-$) is coupled between a node 207 and the second differential input 223, and a sixth resistive element 217 ($R_3^-$) is coupled between the second differential output 225 and the node 207. In an exemplary embodiment, the resistive elements 212, 213, 214, 215, 216, 217 are each realized as a resistor. In alternative embodiments, one or more of the resistive elements 212, 213, 214, 215, 216, 217 may be realized as a combination of resistors in parallel and/or in series, or in another suitable configuration known in the art.

In an exemplary embodiment, a first capacitive element 218 ($C_1^+$) is coupled between the first differential output 224 and the first differential input 222 and a second capacitive element 220 ($C_2^+$) is coupled between the second differential output 225 and the node 206. A third capacitive element 219 ($C_1^-$) is coupled between the second differential output 225 and the second differential input 223 and a fourth capacitive element 221 ($C_2^+$) is coupled between the node 207 and the first differential output 224. In an exemplary embodiment, the capacitive elements 218, 219, 220, 221 are each realized as a capacitor. These, and possibly other elements, may be suitably configured to generate output signals ($V_{OUT}^+$ and $V_{OUT}^-$) based on the input signals ($V_{IN}^+$ and $V_{IN}^-$) in a manner that compensates for the phase response and group delay of another system and/or circuit element (e.g., low noise filter 116) as described herein.

As the described above, in an exemplary embodiment, the differential biquad filter 200 is achieved by implementing the circuitry shown in FIG. 2 in a balanced or symmetrical manner (i.e., using identical components for the + and the − paths). In other words, the positive path and the negative path are symmetrical, such that the resistance of the first resistive element 212 is substantially equal (within practical and realistic operating tolerances) to the resistance of the fourth resistive element 213, the resistance of the second resistive element 214 is substantially equal to the resistance of the fifth resistive element 215 (within practical and realistic operating tolerances), and the resistance of the third resistive element 216 is substantially equal to the resistance of the sixth resistive element 217 (within practical and realistic operating tolerances). Similarly, the capacitance of the first capacitive element 218 is substantially equal to the capacitance of the third capacitive element 219 (within practical and realistic operating tolerances), and the capacitance of the second capacitive element 220 is substantially equal to the capacitance of the fourth capacitive element 221 (within practical and realistic operating tolerances).

Figure 3:
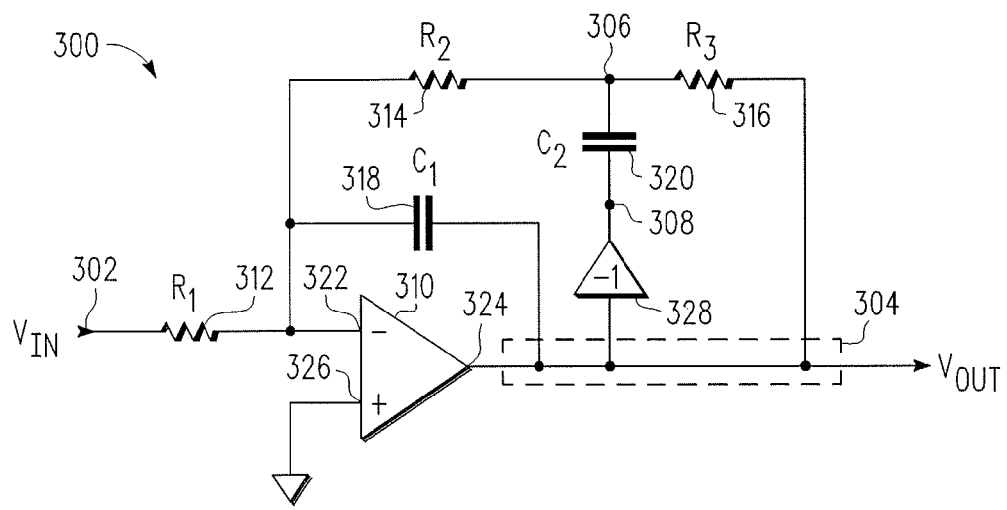
FIG. 3 is a schematic diagram of a single-ended implementation of a biquad filter suitable for use in the transmitter of FIG. 1 in accordance with one embodiment of the present invention.

FIG. 3 depicts a single-ended implementation of a biquad filter 300 suitable for use as the compensation filter 114 in the transmitter 100 of FIG. 1. As shown, the biquad filter 300 is realized as an active filter and includes, without limitation, an input node 302 for an input signal ($V_{IN}$), an output node 304 for an output signal ($V_{OUT}$), a first node 306, a second node 308 for an inverse of the output signal (e.g., $-V_{OUT}$), an amplifier 310, a first resistive element 312, a second resistive element 314, a third resistive element 316, a first capacitive element 318, and a second capacitive element 320. These, and possibly other elements, may be suitably configured to generate the output signal ($V_{OUT}$) based on the input signal ($V_{IN}$) in a manner that compensates for the phase response and group delay of another system and/or circuit element (e.g., low noise filter 116) as described herein.

In an exemplary embodiment, the amplifier 310 has an amplifier input 322 and an amplifier output 324 coupled to the output node 304. In an exemplary embodiment, the amplifier input 322 is realized as an inverting input and a non-inverting input 326 of the amplifier 310 is coupled to a reference potential. The amplifier 310 is configured to produce the output signal ($V_{OUT}$) at the amplifier output 324 based on a signal at the first amplifier input 322. The first resistive element 312 ($R_1$) is coupled between the input node 302 and the amplifier input 322. The second resistive element 314 ($R_2$) is coupled between the node 306 and the amplifier input 322. The third resistive element 316 ($R_3$) is coupled between the amplifier output 324 and the node 306. The first capacitive element 318 ($C_1$) is coupled between the amplifier output 324 and the amplifier input 322. The second capacitive element 320 ($C_2$) is coupled between the node 306 and the node 308.

As described in above in regards to FIG. 2, in accordance with one embodiment, if the amplifier 310 is a fully differential amplifier and the node 308 may be coupled to a differential output (e.g., the negative output). It should be appreciated that a differential amplifier output is one exemplary means for providing the inverse of the output signal to the second node 308. In alternative embodiments, other suitable means for providing the inverse of the output signal to the node 308 may be used, as will be appreciated in the art. For example, as shown in FIG. 2, the inverse of the output signal (e.g., $-V_{OUT}$) may be realized at the node 308 by an inverting circuit element 328 coupled between the output node 304 and the node 308. In this regard, the inverting circuit element 328 is configured to generate the inverse of the output signal (e.g., $-V_{OUT}$) by inverting the signal at the output node 304 with substantially unity gain. The inverting circuit element 328 may be realized in a conventional manner using logic gates, transistors, operational amplifiers, passive circuit elements, and/or various combinations thereof.

Referring now to FIG. 2 and FIG. 3, the transfer function of the output signal relative to the input signal of the biquad filter 200, 300 (e.g., $V_{OUT}^+$ relative to $V_{IN}^+$, $V_{OUT}^-$ relative to $V_{IN}^-$, $V_{OUT}$ relative to $V_{IN}$) in the frequency domain is equal to $$H(s) = \frac{-R_2 - R_3 - C_2 R_2 R_3 s}{R_1 + R_1(C_1 R_2 + C_1 R_3 - C_2 R_3)s + C_1 C_2 R_1 R_2 R_3 s^2}.$$

For the positive path (e.g., $V_{OUT}^+$ relative to $V_{IN}^-$) of the biquad filter 200: $R_1$ is a resistance of the first resistive element 212, $R_2$ is a resistance of the second resistive element 214, $R_3$ is a resistance of the third resistive element 216, $C_1$ is a capacitance of the first capacitive element 218, and $C_2$ is a capacitance of the second capacitive element 220. Similarly, the transfer function for the negative path ($V_{OUT}^-$ relative to $V_{IN}^-$) of the biquad filter 200 or the biquad filter 300 is equivalent to the transfer function for the positive path of biquad filter 200 by substituting the respective counterpart elements of the biquad filter 200, 300, as will be appreciated in the art. In an exemplary embodiment, the precise component values of the elements in the biquad filter 200, 300 may be chosen based on the desired cutoff frequency, quality factor (Q), gain and/or other performance metrics in a conventional manner.

It follows from the transfer function set forth above that the quality factor of the biquad filter 200, 300 may be represented by $$Q = \sqrt{\frac{C_1 C_2 R_2 R_3}{[C_2 R_3 - C_1(R_2 + R_3)]^2}}.$$

It should be noted that by virtue of incorporating the inverted and/or differential output (e.g., $-V_{OUT}$) in the feedback path of the biquad filter 200, 300, the denominator of the quality factor equation contains a negative term, thereby allowing the system designer to achieve a high quality factor (Q) while using only a single amplifier by reducing the value of the denominator term. It will be appreciated in the art that as a result, the biquad filter 200, 300 can be tailored to achieve high quality factors (e.g., quality factors greater than ten) as needed without additional amplifiers or other components. Additionally, by virtue of having only a single zero in the numerator of the transfer function, a system designer may adjust the location of the zero to adjust the phase response of the biquad filter 200, 300 and thereby compensate for group delay of other system components (e.g., low noise filter 116).

One advantage of the systems and/or methods described above is that a high quality factor and low noise biquad filter for adjusting group delay in a transmitter may be realized with only a single amplifier. As a result, the compensation filter in the transmitter utilizes fewer components, less area and/or volume, and consumes less current and/or power relative to other filter topologies. For example, the fully differential biquad filter described herein may reduce the power consumption of the compensation filter by as much as 50% when compared to other filter topologies which need additional amplifiers to achieve high quality factors for adjusting the group delay.

In summary, systems, devices, and methods configured in accordance with example embodiments of the subject matter relate to:

An apparatus is provided for a filter. In an exemplary embodiment, the filter comprises a first input node for a first input signal, a first output node for a first output signal, a first node, a second node for an inverse of the first output signal, and an amplifier having a first amplifier input and a first amplifier output. The first amplifier output is coupled to the first output node, wherein the amplifier is configured to produce the first output signal at the first amplifier output based on a signal at the first amplifier input. The filter further comprises a first resistive element coupled between the first input node and the first amplifier input, a second resistive element coupled between the first node and the first amplifier input, and a third resistive element coupled between the first amplifier output and the first node. A first capacitive element is coupled between the first amplifier output and the first amplifier input, and a second capacitive element is coupled between the first node and the second node.

In accordance with one embodiment, a transfer function of the first output signal relative to the first input signal is equal to $$H(s) = \frac{-R_2 - R_3 - C_2 R_2 R_3 s}{R_1 + R_1(C_1 R_2 + C_1 R_3 - C_2 R_3)s + C_1 C_2 R_1 R_2 R_3 s^2},$$

where $R_1$ is a resistance of the first resistive element, $R_2$ is a resistance of the second resistive element, $R_3$ is a resistance of the third resistive element, $C_1$ is a capacitance of the first capacitive element, and $C_2$ is a capacitance of the second capacitive element. In another embodiment, the filter has a quality factor equal to $$Q = \sqrt{\frac{C_1 C_2 R_2 R_3}{[C_2 R_3 - C_1(R_2 + R_3)]^2}}.$$

In accordance with one embodiment, the filter further comprises means for providing the inverse of the output signal to the second node.

In a further embodiment, the amplifier is a differential amplifier having a first differential input, a second differential input, a first differential output, and a second differential output, wherein the first amplifier input comprises the first differential input, the first amplifier output comprises the first differential output, and the second differential output is coupled to the second node. The differential amplifier is configured to produce the first output signal at the first differential output and a second output signal at the second differential output based at least in part on a difference between a signal at the first differential input and a signal at the second differential input, wherein the second output signal is substantially equal to the inverse of the first output signal. In yet another embodiment, the filter further comprises a second input node for a second input signal, a third node, a fourth resistive element coupled between the second input node and the second differential input, a fifth resistive element coupled between the third node and the second differential input, a sixth resistive element coupled between the second differential output and the third node, a third capacitive element coupled between the second differential output and the second differential input, and a fourth capacitive element coupled between the third node and the first differential output. In accordance with one embodiment, the first differential input comprises a negative input, the second differential input comprises a positive input, the first differential output comprises a positive output, and the second differential output comprises a negative output.

In another embodiment, an apparatus is provided for a radio frequency transmitter. In an exemplary embodiment, the radio frequency transmitter comprises a digital-to-analog conversion module configured to generate an input signal based on a baseband signal and a first filter having a cutoff frequency, wherein the first filter is configured to generate a first signal by attenuating frequency components of a second signal above the cutoff frequency. A second filter is coupled between the first filter and the digital-to-analog conversion module. The second filter has only one amplifier, and the second filter is configured to generate the second signal based on the input signal by compensating for a phase response of the first filter such that a group delay of the first signal relative to the input signal is substantially constant for frequencies less than the cutoff frequency. A modulation module is coupled to the first filter and generates an output signal by modulating the first signal using a carrier signal.

In a further embodiment, the second filter comprises a first input node for the input signal, a first output node for the second signal, a first node, a second node for an inverse of the second signal, and an amplifier having a first amplifier input and a first amplifier output. The first amplifier output is coupled to the first output node, wherein the amplifier is configured to produce the second signal at the first amplifier output based on a signal at the first amplifier input. A first resistive element is coupled between the first input node and the first amplifier input, a second resistive element is coupled between the first node and the first amplifier input, and a third resistive element is coupled between the first amplifier output and the first node. A first capacitive element is coupled between the first amplifier output and the first amplifier input, and a second capacitive element is coupled between the first node and the second node. In another embodiment, the amplifier is configured to produce the inverse of the second signal at a second amplifier output, wherein the second node is coupled to the second amplifier output. In accordance with one embodiment, a magnitude of the group delay of the first signal relative to the input signal is less than seven nanoseconds for frequencies less than the cutoff frequency. In yet another embodiment, the quality factor of the second filter is greater than ten.

In yet another embodiment, an apparatus is provided for a differential filter. The differential filter comprises a first input node for a first input signal, a second input node for a second input signal, a first node, and a differential amplifier. The differential amplifier has a first differential input, a second differential input coupled to the second input node, a first differential output, and a second differential output, wherein the differential amplifier is configured to produce a first output signal at the first differential output and a second output signal at the second differential output based at least in part on a difference between a signal at the first differential input and a signal at the second differential input. The second output signal is substantially equal to an inverse of the first output signal. A first resistive element is coupled between the first input node and the first differential input, a second resistive element is coupled between the first node and the first differential input, and a third resistive element coupled between the first differential output and the first node. A first capacitive element is coupled between the first differential output and the first differential input, and a second capacitive element is coupled between the second differential output and the first node.

In accordance with one embodiment, a transfer function of the first output signal relative to the first input signal is equal to $$H(s) = \frac{-R_2 - R_3 - C_2 R_2 R_3 s}{R_1 + R_1(C_1 R_2 + C_1 R_3 - C_2 R_3)s + C_1 C_2 R_1 R_2 R_3 s^2},$$

where $R_1$ is a resistance of the first resistive element, $R_2$ is a resistance of the second resistive element, $R_3$ is a resistance of the third resistive element, $C_1$ is a capacitance of the first capacitive element, and $C_2$ is a capacitance of the second capacitive element. In another embodiment, the differential filter has a quality factor equal to $$Q = \sqrt{\frac{C_1 C_2 R_2 R_3}{[C_2 R_3 - C_1 (R_2 + R_3)]^2}}.$$

In accordance with one embodiment, the quality factor is greater than ten. In yet another embodiment, the differential filter further comprises a second node, a fourth resistive element coupled between the second input node and the second differential input, a fifth resistive element coupled between the second node and the second differential input, a sixth resistive element coupled between the second differential output and the second node, a third capacitive element coupled between the second differential output and the second differential input, and a fourth capacitive element coupled between the second node and the first differential output. In accordance with one embodiment, the resistance of the first resistive element is substantially equal to the resistance of the fourth resistive element, the resistance of the second resistive element is substantially equal to the resistance of the fifth resistive element, the resistance of the third resistive element is substantially equal to the resistance of the sixth resistive element, the capacitance of the first capacitive element is substantially equal to the capacitance of the third capacitive element, and the capacitance of the second capacitive element is substantially equal to the capacitance of the fourth capacitive element. In yet another embodiment, the first differential input comprises a negative input, the second differential input comprises a positive input, the first differential output comprises a positive output, and the second differential output comprises a negative output.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A radio frequency transmitter comprising:
a digital-to-analog conversion module configured to generate an input signal based on a baseband signal;
a first filter having a cutoff frequency, wherein the first filter is configured to generate a first signal by attenuating frequency components of a second signal above the cutoff frequency;
a second filter coupled between the first filter and the digital-to-analog conversion module, the second filter having only one amplifier, wherein:
the second filter is configured to generate the second signal based on the input signal by compensating for a phase response of the first filter such that a group delay of the first signal relative to the input signal is substantially constant for frequencies less than the cutoff frequency; and
the second filter comprises a second-order active filter; and
a modulation module coupled to the first filter, the modulation module being configured to generate an output signal by modulating the first signal using a carrier signal.

2. The radio frequency transmitter of claim 1, wherein a magnitude of the group delay of the first signal relative to the input signal is less than seven nanoseconds for frequencies less than the cutoff frequency.

3. The radio frequency transmitter of claim 1, wherein a quality factor of the second filter is greater than ten.

4. The radio frequency transmitter of claim 1, wherein a numerator of a transfer function of the second filter includes a single zero.

5. The radio frequency transmitter of claim 1, further comprising a baseband module coupled to the digital-to-analog conversion module, the baseband module providing a digital baseband signal, wherein the digital-to-analog conversion module generates the input signal based on the baseband signal by converting the digital baseband signal to an analog input signal, the input signal comprising the analog input signal.

6. The radio frequency transmitter of claim 1, further comprising a reconstruction filter module, the reconstruction filter module including the first filter and the second filter, the reconstruction filter module filtering the input signal with a substantially flat gain response and a substantially constant group delay for passband frequencies below the cutoff frequency to obtain the first signal.

7. The radio frequency transmitter of claim 1, wherein the first filter comprises an image rejection filter and the second filter comprises a compensation filter that filters the input signal in a manner that compensates for the phase response of the image rejection filter.

8. The radio frequency transmitter of claim 1, wherein a phase response of a transfer function for the second filter approximates an inverse of the phase response of the first filter over passband frequencies below the cutoff frequency.

9. The radio frequency transmitter of claim 1, wherein the second filter comprises a biquad filter.

10. A radio frequency transmitter comprising:
a digital-to-analog conversion module configured to generate an input signal based on a baseband signal;
a first filter having a cutoff frequency, wherein the first filter is configured to generate a first signal by attenuating frequency components of a second signal above the cutoff frequency;
a second filter coupled between the first filter and the digital-to-analog conversion module, the second filter having only one amplifier, wherein the second filter is configured to generate the second signal based on the input signal by compensating for a phase response of the first filter such that a group delay of the first signal relative to the input signal is substantially constant for frequencies less than the cutoff frequency; and
a modulation module coupled to the first filter, the modulation module being configured to generate an output signal by modulating the first signal using a carrier signal, wherein the second filter comprises:
a first input node for the input signal;
a first output node for the second signal;
a first node;
a second node for an inverse of the second signal;
an amplifier having a first amplifier input and a first amplifier output, the first amplifier output being coupled to the first output node, wherein the amplifier is configured to produce the second signal at the first amplifier output based on a signal at the first amplifier input;
a first resistive element coupled between the first input node and the first amplifier input;
a second resistive element coupled between the first node and the first amplifier input;
a third resistive element coupled between the first amplifier output and the first node;
a first capacitive element coupled between the first amplifier output and the first amplifier input; and
a second capacitive element coupled between the first node and the second node.

11. The radio frequency transmitter of claim 10, wherein a transfer function of the second signal relative to the input signal is equal to $$H(s) = \frac{-R_2 - R_3 - C_2 R_2 R_3 s}{R_1 + R_1(C_1 R_2 + C_1 R_3 - C_2 R_3)s + C_1 C_2 R_1 R_2 R_3 s^2},$$

where $R_1$ is a resistance of the first resistive element, $R_2$ is a resistance of the second resistive element, $R_3$ is a resistance of the third resistive element, $C_1$ is a capacitance of the first capacitive element, and $C_2$ is a capacitance of the second capacitive element.

12. The radio frequency transmitter of claim 10, wherein the second filter has a quality factor equal to $$Q = \sqrt{\frac{C_1 C_2 R_2 R_3}{[C_2 R_3 - C_1(R_2 + R_3)]^2}},$$

where $R_1$ is a resistance of the first resistive element, $R_2$ is a resistance of the second resistive element, $R_3$ is a resistance of the third resistive element, $C_1$ is a capacitance of the first capacitive element, and $C_2$ is a capacitance of the second capacitive element.

13. The radio frequency transmitter of claim 10, further comprising means for providing the inverse of the output signal to the second node.

14. The radio frequency transmitter of claim 10, wherein:
the amplifier is a differential amplifier having a first differential input, a second differential input, a first differential output, and a second differential output;
the first amplifier input comprises the first differential input;
the first amplifier output comprises the first differential output; and
the second differential output is coupled to the second node.

15. The radio frequency transmitter of claim 14, wherein the differential amplifier is configured to produce the second signal at the first differential output and a second output signal at the second differential output based at least in part on a difference between a signal at the first differential input and a signal at the second differential input, wherein the second output signal is substantially equal to the inverse of the second signal.

16. The radio frequency transmitter of claim 15, further comprising:
a second input node for a second input signal;
a third node;
a fourth resistive element coupled between the second input node and the second differential input;
a fifth resistive element coupled between the third node and the second differential input;
a sixth resistive element coupled between the second differential output and the third node;
a third capacitive element coupled between the second differential output and the second differential input; and
a fourth capacitive element coupled between the third node and the first differential output.

17. The radio frequency transmitter of claim 16, wherein:
the first differential input comprises a negative input;
the second differential input comprises a positive input;
the first differential output comprises a positive output; and
the second differential output comprises a negative output.

18. The radio frequency transmitter of claim 10, the amplifier is configured to produce the inverse of the second signal at a second amplifier output, wherein the second node is coupled to the second amplifier output.

19. A radio frequency transmitter comprising:
a digital-to-analog conversion module configured to generate an input signal based on a baseband signal;
a first filter having a cutoff frequency, wherein the first filter is configured to generate a first signal by attenuating frequency components of a second signal above the cutoff frequency;
a second filter coupled between the first filter and the digital-to-analog conversion module, the second filter having only one amplifier, wherein the second filter is configured to generate the second signal based on the input signal by compensating for a phase response of the first filter such that a group delay of the first signal relative to the input signal is substantially constant for frequencies less than the cutoff frequency; and
a modulation module coupled to the first filter, the modulation module being configured to generate an output signal by modulating the first signal using a carrier signal, wherein the second filter comprises:
a first input node for the input signal;
a first output node for the second signal;
a first node;
a second node for an inverse of the second signal;
an amplifier having a first amplifier input and a first amplifier output, the first amplifier output being coupled to the first output node, wherein the amplifier is configured to produce the second signal at the first amplifier output based on a signal at the first amplifier input;
a first resistive element connected electrically in series between the first input node and the first amplifier input;
a second resistive element coupled electrically in series between the first node and the first amplifier input;
a third resistive element coupled between the first amplifier output and the first node;
a first capacitive element coupled between the first amplifier output and the first amplifier input; and
a second capacitive element connected between the first node and the second node.

20. The radio frequency transmitter of claim 19, wherein the second capacitive element is connected electrically in series between the first node and the second node.

* * * * *